United States Patent
Shin et al.

(10) Patent No.: US 8,924,118 B2
(45) Date of Patent: Dec. 30, 2014

(54) TRANSFER SYSTEM

(71) Applicant: Kabushiki Kaisha Yaskawa Denki, Kitakyushu-shi (JP)

(72) Inventors: Daisuke Shin, Kitakyushu (JP); Yoshiki Kimura, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 72 days.

(21) Appl. No.: 13/742,348

(22) Filed: Jan. 16, 2013

(65) Prior Publication Data
US 2013/0195601 A1 Aug. 1, 2013

(30) Foreign Application Priority Data
Jan. 31, 2012 (JP) ................................. 2012-018981

(51) Int. Cl.
G06F 19/00 (2011.01)
H01L 21/677 (2006.01)
B25J 9/02 (2006.01)

(52) U.S. Cl.
CPC ................. H01L 21/677 (2013.01); B25J 9/02 (2013.01); H01L 21/67766 (2013.01); H01L 21/67772 (2013.01); Y10S 901/40 (2013.01)
USPC ............. 701/70; 700/214; 700/217; 700/218; 414/216; 414/217; 414/219; 118/52; 118/56; 118/57; 29/783; 29/784; 29/799; 901/40

(58) Field of Classification Search
CPC .. C23C 14/505; C23C 14/352; C23C 14/022; H01J 37/32743; H01L 21/6719
USPC .......................... 700/245, 255, 214, 217, 218; 204/192.11, 298.11, 298.16, 298.25, 204/192.1; 701/70; 414/216, 217, 219; 118/52, 56, 72; 29/783, 799, 784; 901/40
See application file for complete search history.

(56) References Cited

U.S. PATENT DOCUMENTS 6,360,144 B1 * 3/2002 Bacchi et al. ................. 700/250
6,366,830 B2 * 4/2002 Bacchi et al. ................. 700/250
(Continued)

FOREIGN PATENT DOCUMENTS

CN 101454125 6/2009
JP 03-256681 11/1991
(Continued)

OTHER PUBLICATIONS

Korean Office Action for corresponding KR Application No. 10-2013-0006059, Dec. 23, 2013.
(Continued)

*Primary Examiner* — McDieunel Marc
(74) *Attorney, Agent, or Firm* — Mori & Ward, LLP (57) ABSTRACT

A transfer system according to an embodiment includes a transfer room, a robot, a trajectory generator, a determination unit, and an output unit. The transfer room has an exclusive area defined by a predetermined distance. The robot has an arm unit that is equipped with a robot hand transferring a thin plate-like workpiece and that operates in horizontal directions. The robot is installed in the transfer room so that a minimum turning area of the arm unit overlaps with a part of the exclusive area. The transfer system generates a trajectory of the robot hand, then determines, based on the generated trajectory, whether a part of the arm unit is included in the exclusive area, and outputs a predetermined signal.

20 Claims, 7 Drawing Sheets

(56) References Cited

U.S. PATENT DOCUMENTS

| | | | |
|---|---|---|---|
| 7,233,841 B2 * | 6/2007 | Sadighi et al. | 700/245 |
| 7,245,989 B2 * | 7/2007 | Hosek et al. | 700/245 |
| 7,627,395 B2 * | 12/2009 | Sadighi et al. | 700/245 |
| 7,874,782 B2 | 1/2011 | Hashimoto | |
| 8,112,177 B2 * | 2/2012 | Adachi et al. | 700/250 |
| 8,121,732 B2 * | 2/2012 | Hashimoto et al. | 700/260 |
| 2003/0083776 A1 * | 5/2003 | Schauer et al. | 700/218 |
| 2007/0071581 A1 * | 3/2007 | Gilchrist et al. | 414/217 |
| 2007/0175864 A1 * | 8/2007 | Niewmierzycki et al. | 216/90 |
| 2010/0150688 A1 * | 6/2010 | Kitahara et al. | 414/226.02 |
| 2013/0195584 A1 * | 8/2013 | Furuichi et al. | 414/217 |

FOREIGN PATENT DOCUMENTS

| | | |
|---|---|---|
| JP | 08-108383 | 4/1996 |
| JP | 2000-174092 | 6/2000 |
| JP | 2004-243427 | 9/2004 |
| JP | 2007-152490 | 6/2007 |
| JP | 2008-028134 | 2/2008 |
| JP | 2008-264980 | 11/2008 |
| JP | 2009-200160 | 9/2009 |
| JP | 2009-233757 | 10/2009 |
| JP | 2010-082742 | 4/2010 |
| JP | 2011-228627 | 11/2011 |
| JP | 2011-233745 | 11/2011 |
| KR | 10-2007-0001636 | 1/2007 |
| KR | 10-2011-0122007 | 11/2011 |
| TW | 200940287 | 10/2009 |
| WO | WO 2009/066573 | 5/2009 |

OTHER PUBLICATIONS

Japanese Office Action for corresponding JP Application No. 2012-018981, Jan. 7, 2014.

Korean Decision of a Patent Grant for corresponding KR Application No. 10-2013-0006059, Jun. 2, 2014.

Taiwanese Office Action for corresponding TW Application No. 102100554, Nov. 4, 2014.

* cited by examiner

TRANSFER SYSTEM

CROSS-REFERENCE TO RELATED APPLICATION

This application is based upon and claims the benefit of priority of the prior Japanese Patent Application No. 2012-018981, filed on Jan. 31, 2012, the entire contents of which are incorporated herein by reference.

FIELD

The embodiment discussed herein is directed to a transfer system.

BACKGROUND

There are conventionally known transfer robots that transfer thin plate-like workpieces such as semiconductor wafers or liquid crystal panels. In addition, there are also known techniques of installing such a transfer robot in a local clean room (hereinafter, referred to as a "transfer room") provided between an opening and closing device for opening and closing a storage container for semiconductor wafers and a processing room for the semiconductor wafers. Note that the transfer room is not limited to be installed only between the storage container and the opening and closing device.

The above-mentioned opening and closing device is called, for example, a load port, and opens and closes, in the transfer room, a detachable cover provided on the storage container. A part of the opening and closing device holds the cover and moves down as a unit together with the cover so as to slide downward, thereby opening the cover of the storage container. The cover is opened in the transfer room, so that dust or the like does not adhere to the thin plate-like workpieces or other parts in the storage container. Opening the cover allows the transfer robot to carry in and out the thin plate-like workpieces. Therefore, the transfer room needs to have therein an area (hereinafter, referred to as an "exclusive area") for the opening and closing device to perform attaching and detaching operations of the cover to and from the body of the storage container. The exclusive area is stipulated in the Semiconductor Equipment and Materials International (SEMI) standard. For that reason, there are proposed techniques for reducing a footprint (area) required by the transfer room while disposing the transfer robot so that the minimum turning area of the transfer robot does not overlap with the exclusive area (refer, for example, to Japanese Patent Application Laid-open No. 2008-28134).

However, when the transfer robot is disposed so that the minimum turning area of the transfer robot does not overlap with the exclusive area, the area of the transfer room as viewed from the top tends to be large, and thus, there has been room for improvement from the viewpoint of downsizing of the transfer room.

SUMMARY

A transfer system according to an aspect of embodiments includes a transfer room, a robot, a trajectory generator, a determination unit, and an output unit. The transfer room has an exclusive area defined by a predetermined distance. The robot has an arm unit that is equipped with a robot hand transferring a thin plate-like workpiece and that operates in horizontal directions. The robot is installed in the transfer room so that a minimum turning area of the arm unit overlaps with a part of the exclusive area. The transfer system generates a trajectory of the robot hand, then determines, based on the generated trajectory, whether a part of the arm unit is included in the exclusive area, and outputs a predetermined signal.

BRIEF DESCRIPTION OF DRAWINGS

A more complete appreciation of the present embodiment and advantages associated therewith will be easily understood by reading the following detailed description of the embodiment with reference to the accompanying drawings.

DESCRIPTION OF EMBODIMENT

An embodiment of a transfer system disclosed herein will be described below in detail with reference to the accompanying drawings. Note that the embodiment is not limited by the embodiment illustrated below.

Figure 1:
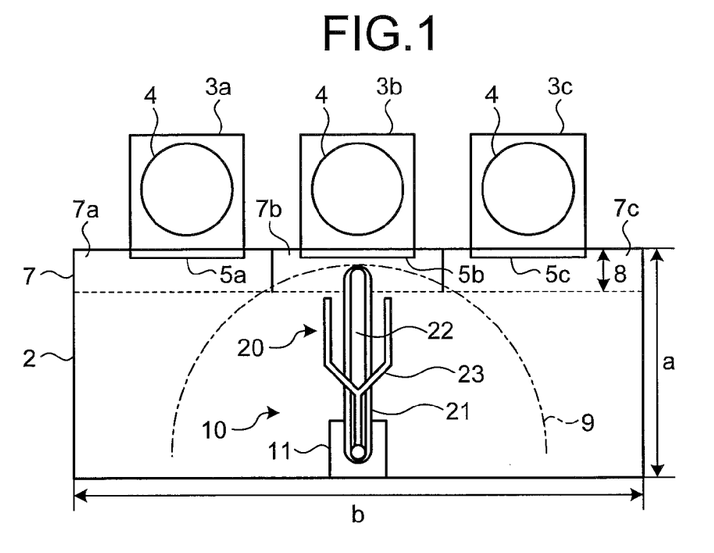
FIG. 1 is a top view of a transfer room according to the present embodiment.

First, the transfer system according to the present embodiment will be described using FIG. 1. FIG. 1 is a top view of a transfer room 2 according to the present embodiment. Note that a part of the shape in FIG. 1 is illustrated in a simplified manner in order to facilitate the description.

As illustrated in FIG. 1, the transfer room 2 is provided, on a wall surface thereof, with opening and closing devices 5 (each being denoted by 5a, 5b, and 5c) arranged side by side, and is arranged, inside thereof, with a transfer robot 10 according to the present embodiment. The transfer room 2 refers to a local clean room called an equipment front end module (EFEM). This transfer room 2 is provided, at an upper part thereof, with a filter (not illustrated) for cleaning gas, and the gas flow that is cleaned by the filter and flows downward cleans the inside of the housing. For that purpose, the transfer room 2 is covered with wall surfaces surrounding the side faces thereof, and is formed to be maintained at a higher gas pressure than the gas pressure outside the transfer room 2 so that dust or the like outside the transfer room 2 does not flow into the inside thereof. Here, the length of the transfer room 2 in the shorter direction is denoted by a reference symbol a, while the length thereof in the longer direction is denoted by a reference symbol b.

Each of the opening and closing device 5 is a device for opening and closing a detachable cover provided on a storage container 3 (each being denoted by 3a, 3b, and 3c) and is installed at an opening formed on the side wall of the transfer room 2. Each of the opening and closing devices 5 is, for example, a device that is called a load port or a FOUP opener, and that is generally compliant with the Semiconductor Equipment and Materials International (SEMI) standard.

The opening and closing device 5 is provided with a movable body called a front-opening interface mechanical standard (FIMS) door that attaches and detaches the cover of the storage container 3. An area (hereinafter, referred to as the "exclusive area 7") for attach/detach operations of such movable bodies is specified in the transfer room 2 in advance. Specifically, the exclusive area 7 is an area extending from the wall surface of the transfer room 2 on which the opening and closing devices 5 are mounted by a predetermined distance 8. The distance 8 is specified by the SEMI standard in advance.

The storage container 3 is a box-like container that can store a plurality of thin plate-like workpieces (hereinafter, referred to as the "wafers 4") such as semiconductor wafers or liquid crystal panels in multiple stages in the height direction, and has the above-mentioned detachable cover on a side face thereof.

The storage container 3 is, for example, a device called a front-opening unified pod (FOUP) specified in the SEMI standard. The storage container 3 is mounted on the opening and closing device 5 so that the cover of the storage container 3 faces the transfer room 2. The movable body provided on the opening and closing device 5 moves down, while holding the cover, so as to slide downward in the transfer room 2, and thereby opens the cover. Details of the attach/detach operation of the cover will be described later using FIGS. 7A and 7B.

Figure 2:
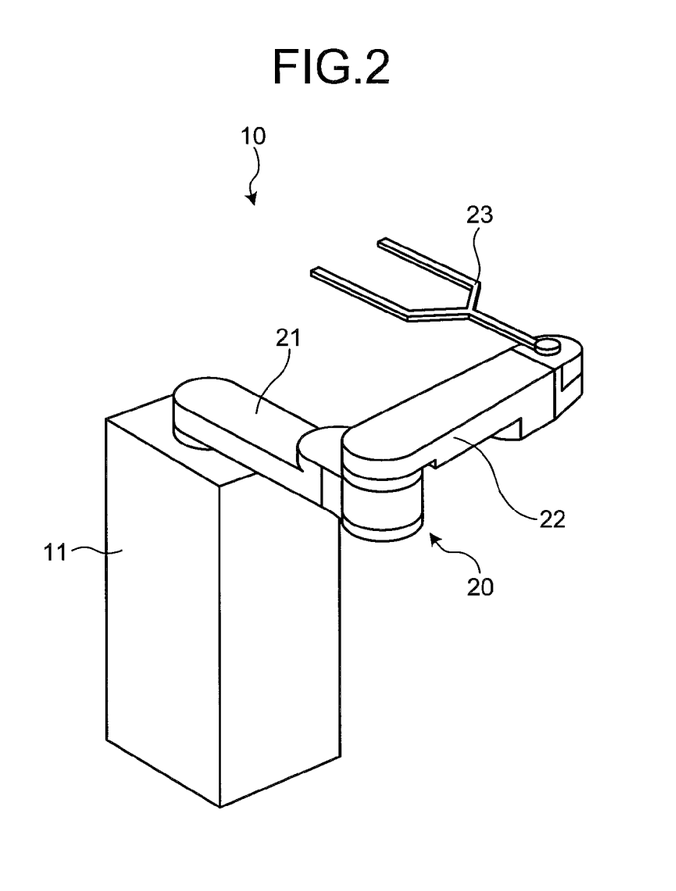
FIG. 2 is a schematic perspective view of a transfer robot according to the present embodiment.

The transfer robot 10 is a robot that can hold the wafer 4 serving as a transferred object, and is installed relatively close to the wall surface opposed to the wall surface of the transfer room 2 on which the opening and closing devices 5 are mounted. Here, details of the transfer robot 10 according to the present embodiment will be described using FIG. 2. FIG. 2 is a schematic perspective view of the transfer robot 10 according to the present embodiment.

As illustrated in FIG. 2, the transfer robot 10 is a horizontal articulated robot that is provided with two arms each of which swings in horizontal directions around a vertical axis. Specifically, the transfer robot 10 is provided with a body 11 and an arm unit 20, and the body 11 is provided with a lifting and lowering mechanism.

The arm unit 20 is provided with a first arm 21, a second arm 22, and a robot hand (hereinafter, referred to as the "hand 23") that can hold the wafer 4 serving as a transferred object. The arm unit 20 is supported so as to be rotatable in horizontal directions on top of the body 11 provided with the lifting and lowering mechanism.

Specifically, the base end of the first arm 21 is rotatably connected to an upper part of the body 11, and the base end of the second arm 22 is rotatably connected to an upper part of the leading end of the first arm 21. The hand 23 is rotatably connected to the leading end of the second arm 22. These parts are rotatable relative to each other, and are each rotated by using a turning mechanism composed of a motor, a reduction gear, and other parts. The turning mechanism including the reduction gear, the motor, etc. may be provided inside the body 11, or may be housed in the arm unit 20.

In the case of the transfer robot 10 according to the present embodiment, description will be made of a single-arm robot having the single arm unit 20 composed of the first arm 21, the second arm 22, and the hand 23. However, not limited to this configuration, the transfer robot 10 may be a dual-arm robot having two arms 20, or may be configured to be provided with three or more arms 20.

In the case of the dual-arm robot, two operations can be simultaneously performed in parallel in such a manner as follows: One of the arms 20 is used to take one of the wafers 4 out of a predetermined transfer position while the other of the arms 20 is used to carry a new one of the wafers 4 into the predetermined transfer position. The transfer robot 10 may also be configured such that the single second arm 22 is provided with two or more hands 23. In that case, the two or more hands 23 are provided so as to be coaxial with each other and rotatable relative to each other. The dual-arm robot, if used, is also provided with a turning mechanism for turning a whole of the two arms 20 of the dual-arm robot.

The base end of the first arm 21 is supported at the upper part of the body 11, and the base end of the second arm 22 is supported at the upper part of the leading end of the first arm 21, each being supported in a rotatable manner and rotated by using the turning mechanism composed of the motor, the reduction gear, and other parts.

The hand 23 for holding the wafer 4 is rotatably connected to the leading end of the second arm 22. The transfer robot 10 moves the hand 23 to a targeted position by rotating the first arm 21, the second arm 22, and the hand 23. The transfer robot 10 can also linearly move the hand 23 by synchronously operating the first arm 21 and the second arm 22.

The lifting and lowering mechanism is configured to include a linear motion guide, a ball screw, and a motor, and thus, lifts and lowers the arm unit 20 along the vertical direction by converting rotational motion of the motor into linear motion. The lifting and lowering mechanism may lift and lower the arm unit 20 using a belt provided along the vertical direction instead of lifting and lowering the arm unit 20 using the ball screw as described above.

With such a configuration, the transfer robot 10 can take the wafer 4 out of the storage container 3 and place the wafer 4 on the hand 23, can transfer the wafer 4 to a predetermined one of processing rooms (not illustrated), and can transfer the wafer 4 to a targeted position, while lifting, lowering, and rotating the arm unit 20.

The processing rooms are rooms that are installed side by side on the transfer room 2 and that are equipped with devices applying, to the wafers 4, predetermined processes such as chemical vapor deposition (CVD), exposure, etching, and ashing.

Referring back to FIG. 1, the following continues the description of the transfer room 2. The arm unit 20 illustrated in FIG. 1 is in a state in which the second arm 22 and the hand 23 are superimposed above the first arm 21, and thus, the whole of the arm unit 20 is folded so as to be shortest. When the first arm 21 swings in this state, the leading end of the first arm 21 traces a circular arc 9. The area occupied by the arc center side of the circular arc 9 is denoted as a minimum turning area of the transfer robot 10.

Here, according to the conventional technology, the transfer robot is disposed so that the minimum turning area of the transfer robot does not overlap with the exclusive area 7. In this case, the conventional transfer system needs to have a larger length than the length a in the shorter direction of the transfer room 2 illustrated in FIG. 1. For this reason, the conventional transfer system leads to a large area of the transfer room as viewed from the top.

Therefore, in the transfer system according to the present embodiment, the transfer robot 10 is disposed so that the minimum turning area of the transfer robot 10 overlaps with the exclusive area 7, and when a part of the arm unit 20 is going to intrude into the exclusive area 7, the attach/detach operation of the cover of the storage container 3 is restricted.

The exclusive area 7 is provided for each of the opening and closing devices 5 for opening and closing the cover of the storage container 3. The transfer system determines whether a part of the arm unit 20 is going to intrude into the exclusive area 7 with respect to each of exclusive areas 7a, 7b, and 7c. Then, when a part of the arm unit 20 is going to intrude into a predetermined exclusive area 7, the transfer system restricts the attach/detach operation of the cover of the storage container 3 corresponding to the predetermined exclusive area 7.

With respect to the case of expected intrusion into the exclusive area 7, the transfer system may determine whether the arm unit 20 is immediately going to intrude into the exclusive area 7 based on the position of the arm unit 20. The transfer system may also predict the time when the arm unit 20 will intrude based on teaching data taught in advance.

Specifically, when a part of the arm unit 20 is going to intrude into the exclusive area 7a, the transfer system notifies an upper-level server to prohibit the attach/detach operation of the cover of the storage container 3a.

Upon receiving the notification to prohibit the attach/detach operation of the cover, the upper-level server issues an instruction to the opening and closing device 5a not to execute the attach/detach operation of the cover. Note that the upper-level server is a device that controls the entire transfer system including the opening and closing devices 5a, 5b, and 5c.

While any one of the opening and closing devices 5a, 5b, and 5c, for example, the opening and closing device 5c is performing the attach/detach operation of the cover, the upper-level server notifies a robot controller for controlling the transfer robot 10 of the fact. Upon receiving the notification that the opening and closing device 5c is performing the attach/detach operation of the cover, the robot controller restricts the arm unit 20 from intruding into the exclusive area 7c. In this case, by allowing the arm unit 20 to intrude into the other exclusive areas 7a and 7b, the robot controller can operate the arm unit 20 to carry the wafers 4 into and out of the storage containers 3a and 3b.

If one of the opening and closing devices 5 corresponding to the storage container 3 that is the next destination of movement of the arm unit 20 is performing the attach/detach operation, the robot controller instructs the transfer robot 10 to take a standby attitude until the attach/detach operation of the cover is terminated.

If all of the opening and closing devices 5a, 5b, and 5c are performing the attach/detach operations of the covers, the robot controller also instructs the transfer robot 10 to take the standby attitude until the attach/detach operation of any one of the covers is terminated.

The standby attitude refers to an attitude of the transfer robot 10 when the arm unit 20 is withdrawn to a position in which the arm unit 20 does not intrude in the exclusive area 7. Details of the standby attitude will be described later using FIG. 6.

In this manner, the transfer robot 10 can be disposed so that the minimum turning area of the transfer robot 10 overlaps with the exclusive area 7, and thereby, the length a in the shorter direction of the transfer room 2 can be made small. As a result, the transfer system according to the present embodiment can contribute to downsizing of the transfer room 2.

The transfer room 2 illustrated in FIG. 1 has a rectangular shape. However, not limited to this shape, the transfer room 2 may have, for example, a polygonal shape or a circular shape.

In the transfer system according to the present embodiment, the transfer robot 10 is also disposed so that the minimum turning area of the transfer robot 10 overlaps with the wall surface (hereinafter, referred to as the "opposed wall surface") opposed to the wall surface of the transfer room 2 on which the opening and closing devices 5 are mounted.

Further, the transfer system according to the present embodiment determines, at each predetermined time point, whether a part of the arm unit 20 will hit the opposed wall surface, and thus avoids the arm unit 20 from touching the opposed wall surface.

The predetermined time point may come immediately before the robot controller issues an operation command to operate the transfer robot 10, or once every predetermined time period during the operation of the transfer robot 10. In this manner, the transfer system according to the present embodiment can safely operate the transfer robot 10, and in addition, the length a in the shorter direction of the transfer room 2 can be made small.

Figure 3:
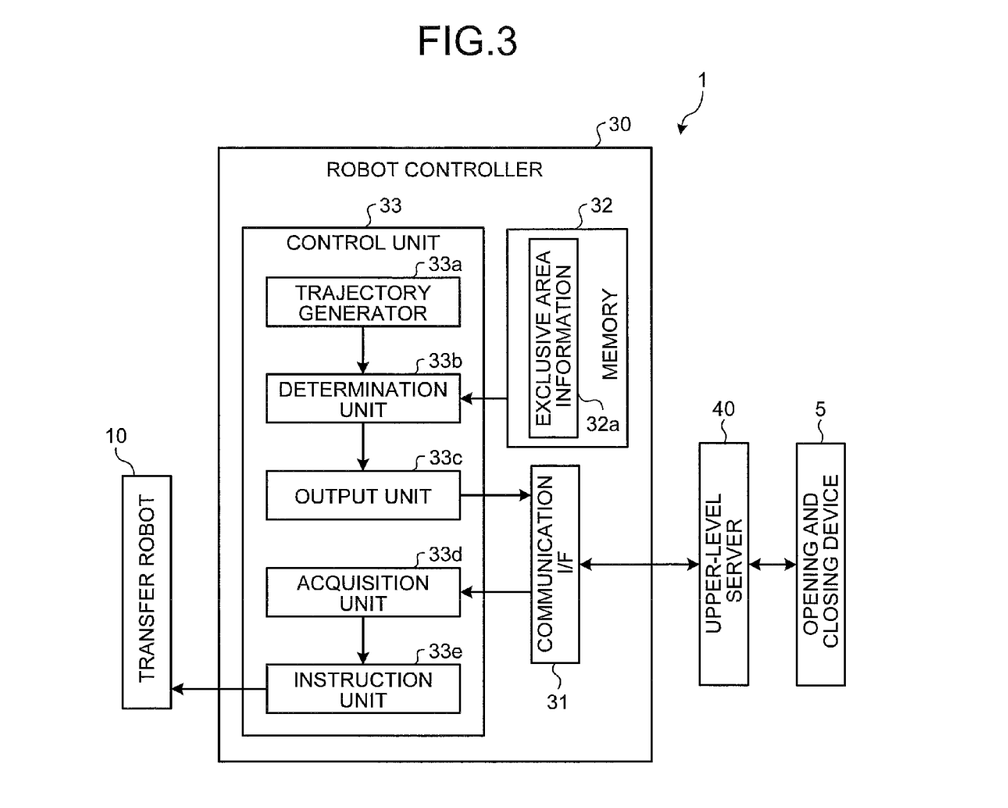
FIG. 3 is a block diagram of a transfer system according to the present embodiment.

Next, a configuration of the transfer system 1 according to the present embodiment will be described using FIG. 3. FIG. 3 is a block diagram of the transfer system 1 according to the present embodiment.

As illustrated in FIG. 3, the transfer system 1 includes the transfer robot 10, a robot controller 30, an upper-level server 40, and the opening and closing devices 5. The robot controller 30 is a controller that controls the operation of the transfer robot 10. The upper-level server 40 is a server that performs overall control of the transfer system 1.

The transfer robot 10 follows transfer instructions from the robot controller 30 or the like to take the wafer 4 out of the storage container 3 and place the wafer 4 on the hand 23, and to transfer the wafer 4 to a targeted position, while lifting, lowering, and rotating the arm unit 20.

The robot controller 30 is provided with a communication interface (I/F) 31, a control unit 33, and a memory 32. Furthermore, the control unit 33 is provided with a trajectory generator 33a, a determination unit 33b, an output unit 33c, an acquisition unit 33d, and an instruction unit 33e, and the memory 32 stores exclusive area information 32a.

The communication I/F 31 is composed of a communication device that sends and receives communication data between the robot controller 30 and the upper-level server 40. For example, when a part of the arm unit 20 is going to intrude into the exclusive area 7, the communication I/F 31 sends the instruction to prohibit the attach/detach operation of the cover to the upper-level server 40.

The memory 32 is a storage unit composed of storage devices such as a random access memory (RAM) and a nonvolatile memory. The memory 32 stores the exclusive area information 32a.

The exclusive area information 32a is information on the exclusive area 7 in the transfer room 2, and includes, for example, the predetermined distance 8 from the wall surface of the transfer room 2 on which the opening and closing devices 5 are mounted.

The control unit 33 is a control unit that performs overall control of the robot controller 30. For example, the control unit 33 issues a transfer instruction to the transfer robot 10 to control the transfer robot 10. Specifically, the control unit 33 controls the motion of the transfer robot 10 in such a manner as to lift or lower the arm unit 20 to a predetermined height, or to rotate the arm unit 20, according to the teaching data taught in advance.

When having received a command for a predetermined operation of the transfer robot 10, the trajectory generator 33a performs processing of generating a trajectory of the hand 23 corresponding to the predetermined operation. For example, when having received a command for movement from a point A to a point B, the trajectory generator 33a generates the trajectory of the hand 23 moving from the point A to the point B. Then, the trajectory generator 33a also performs processing of sending the generated trajectory of the hand 23 to the determination unit 33b.

Based on the trajectory of the hand 23 received from the trajectory generator 33a, the determination unit 33b determines whether a part of the arm unit 20 is going to intrude into the exclusive area 7, and performs processing of sending the result of the determination to the output unit 33c.

In addition, based on the trajectory of the hand 23 received from the trajectory generator 33a, the determination unit 33b determines, at each of the predetermined time points, whether a part of the arm unit 20 will hit the opposed wall surface, and performs the processing of avoiding the arm unit 20 from touching the opposed wall surface.

Figure 4:
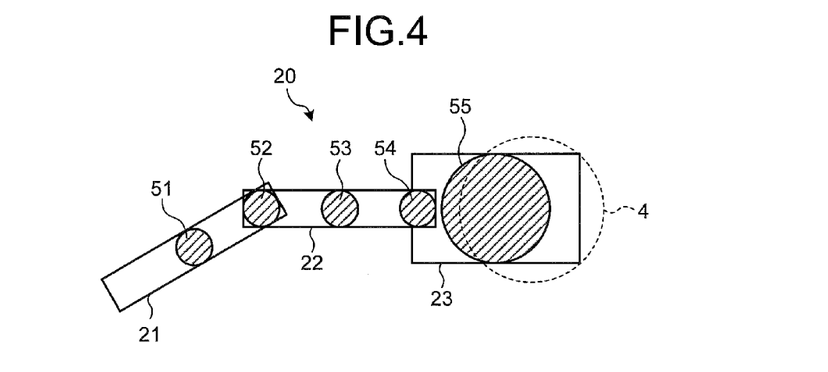
FIG. 4 is a first explanatory diagram of intrusion determination processing.
Figure 5:
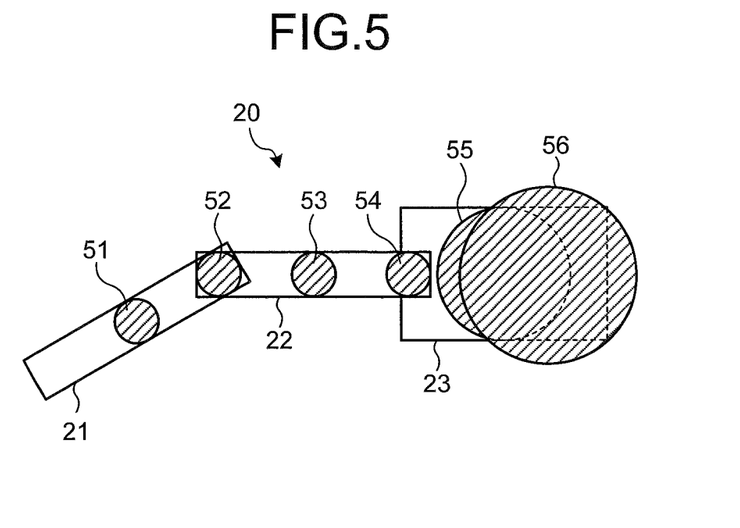
FIG. 5 is a second explanatory diagram of the intrusion determination processing.

Here, description will be made, using FIGS. 4 and 5, of details of the intrusion determination processing performed by the determination unit 33b to determine whether a part of the arm unit 20 is going to intrude into the exclusive area 7. FIGS. 4 and 5 are explanatory diagrams of the intrusion determination processing. Note that a part of the shape in each of FIGS. 4 and 5 is illustrated in a simplified manner in order to facilitate the description.

The determination unit 33b sets virtual FIGS. 51 to 55 at joints where the first arm 21, the second arm 22, and the hand 23 of the arm unit 20 are rotatably connected to each other, and at the centers of the arms.

As illustrated in FIG. 4, the determination unit 33b sets, as the virtual FIGS. 51 to 55, circles each of which is set so as to contain the arm width of each of the arms. For example, the determination unit 33b sets the virtual FIGS. 51, 53, and 55 to be circles having centers in positions bisecting the arm lengths of the first arm 21, the second arm 22, and the hand 23, respectively, and having diameters equal to the arm widths of the arms 21 and 22 and the hand 23, respectively.

In addition, the determination unit 33b sets the virtual FIGS. 52 and 54 to be circles positioned at the leading end of the first arm 21 and at the leading end of the second arm 22, respectively, and having diameters equal to the arm widths of the arms 21 and 22, respectively. Then, when the hand 23 is operated along the trajectory thereof received from the trajectory generator 33a, the determination unit 33b determines whether each of the virtual FIGS. 51 to 55 will intrude into the exclusive area 7.

If, for example, the hand 23 is a suction-type hand, the wafer 4 is held, when being held by the hand 23, in a position protruding from the hand 23 as illustrated by a dashed line. Therefore, when the wafer 4 is held by the hand 23, the intrusion determination processing is performed in the following manner.

In this case, as illustrated in FIG. 5, the determination unit 33b includes, in addition to the virtual FIGS. 51 to 55, a virtual FIG. 56 that is positioned where the wafer 4 is held and sized to have the same outer shape of the wafer 4, and determines whether each of the virtual FIGS. 51 to 56 will intrude into the exclusive area 7. With this configuration, even when the wafer 4 is held by the hand 23, the determination unit 33b can accurately determine whether a part of the arm unit 20 will intrude into the exclusive area 7.

Also, when the determination unit 33b determines whether a part of the arm unit 20 will hit the opposed wall surface, the determination unit 33b determines whether the hitting will occur based on the above-described virtual FIGS. 51 to 56.

Referring back to FIG. 3, the following continues the description of the configuration of the transfer system 1. When having received, from the determination unit 33b, the result of determination that a part of the arm unit 20 will intrude or has intruded into the exclusive area 7, the output unit 33c performs the processing of sending a prohibition notification to prohibit the attach/detach operation of the covers performed by the opening and closing devices 5 to the upper-level server 40 via the communication I/F 31. Then, upon receiving the prohibition notification from the output unit 33c, the upper-level server 40 instructs the opening and closing devices 5 not to execute the attach/detach operations of the covers.

The acquisition unit 33d performs processing of obtaining operating states of the opening and closing devices 5 via the upper-level server 40 and sending the obtained operating states to the instruction unit 33e. Specifically, the acquisition unit 33d obtains an execution notification of the attach/detach operation if any one of the opening and closing devices 5a, 5b, and 5c installed side by side on the transfer room 2 is about to execute or executing the attach/detach operation. Here, the time the opening and closing device 5 is about to execute the attach/detach operation is defined as a time point a predetermined period before the attach/detach operation is executed, where the predetermined period is a period specified in advance.

Figure 6:
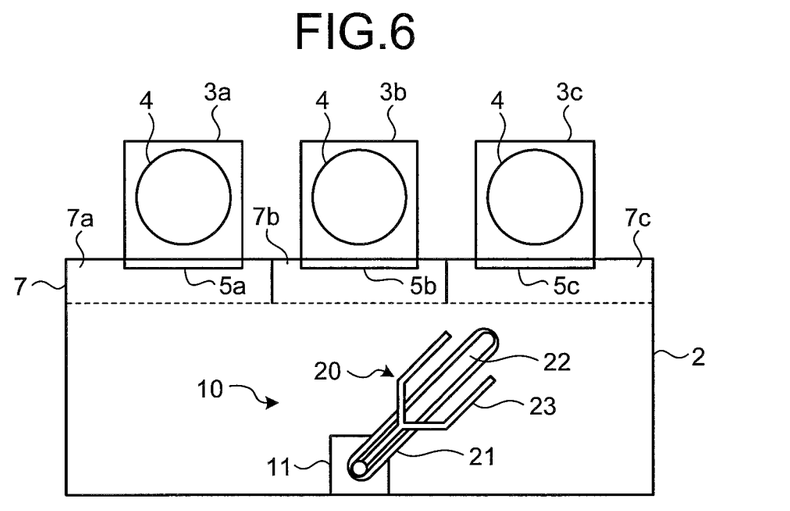
FIG. 6 is an explanatory diagram of a standby attitude of the transfer robot.

When the acquisition unit 33d receives the execution notification of the attach/detach operation, the instruction unit 33e performs the processing of instructing the transfer robot 10 to place the arm unit 20 in the standby attitude. Here, the details of the standby attitude will be described using FIG. 6. FIG. 6 is an explanatory diagram of the standby attitude of the transfer robot 10. As illustrated in FIG. 6, the transfer robot 10 places the arm unit 20 in the standby attitude according to the instruction from the instruction unit 33e.

Specifically, the standby attitude is defined as a state in which the second arm 22 and the hand 23 are superimposed above the first arm 21, and thus, the whole of the arm unit 20 is folded so as to be shortest. The standby attitude is further defined as a state obtained by turning the arm unit 20 from a state where the first arm 21 is in parallel with the shorter direction of the transfer room 2 to a state where the leading end of the first arm 21 does not intrude into the exclusive area 7.

In this manner, by placing the arm unit 20 in the state of the standby attitude, the transfer robot 10 can quickly move the hand 23 to a desired position after the opening and closing devices 5 terminate the attach/detach operations.

Referring back to FIG. 3, the following continues the description of the configuration of the transfer system 1. Upon receiving, from the robot controller 30, the prohibition notification to prohibit the attach/detach operation of the cover performed by any one of the opening and closing devices 5a, 5b, and 5c, the upper-level server 40 performs control so as to prohibit the attach/detach operation performed by this opening and closing device 5a, 5b, or 5c that has received the prohibition notification.

The upper-level server 40 sends the execution notification of the attach/detach operation to the robot controller 30 before making the opening and closing device 5 execute the attach/detach operation. Although, here, the robot controller 30 and the upper-level server 40 are separate devices, they may be constituted by the same device.

In this manner, in the transfer system 1 according to the present embodiment, when a part of the arm unit 20 is going to intrude into any one of the exclusive areas 7a, 7b, and 7c, the robot controller 30 sends, to the upper-level server 40, the prohibition notification so as to prohibit the attach/detach operation of the cover of the corresponding storage container 3. Upon receiving the prohibition notification to prohibit the attach/detach operation of the cover, the upper-level server 40 refrains from performing the attach/detach operation of the cover.

If any one of the opening and closing devices 5a, 5b, and 5c installed side by side on the transfer room 2 is about to execute or executing the attach/detach operation, the upper-level server 40 sends the execution notification to the robot controller 30 that controls the transfer robot 10. Upon receiving the execution notification of the attach/detach operation, the robot controller 30 limits the arm unit 20 so as not to intrude into the exclusive area 7 corresponding to the storage container 3 until the attach/detach operation of the cover of the corresponding storage container 3 is terminated.

In this manner, the transfer robot 10 can be disposed so that the minimum turning area of the transfer robot 10 overlaps with the exclusive area 7, and thereby, the length a in the shorter direction of the transfer room 2 can be made small.

Figure 7A:
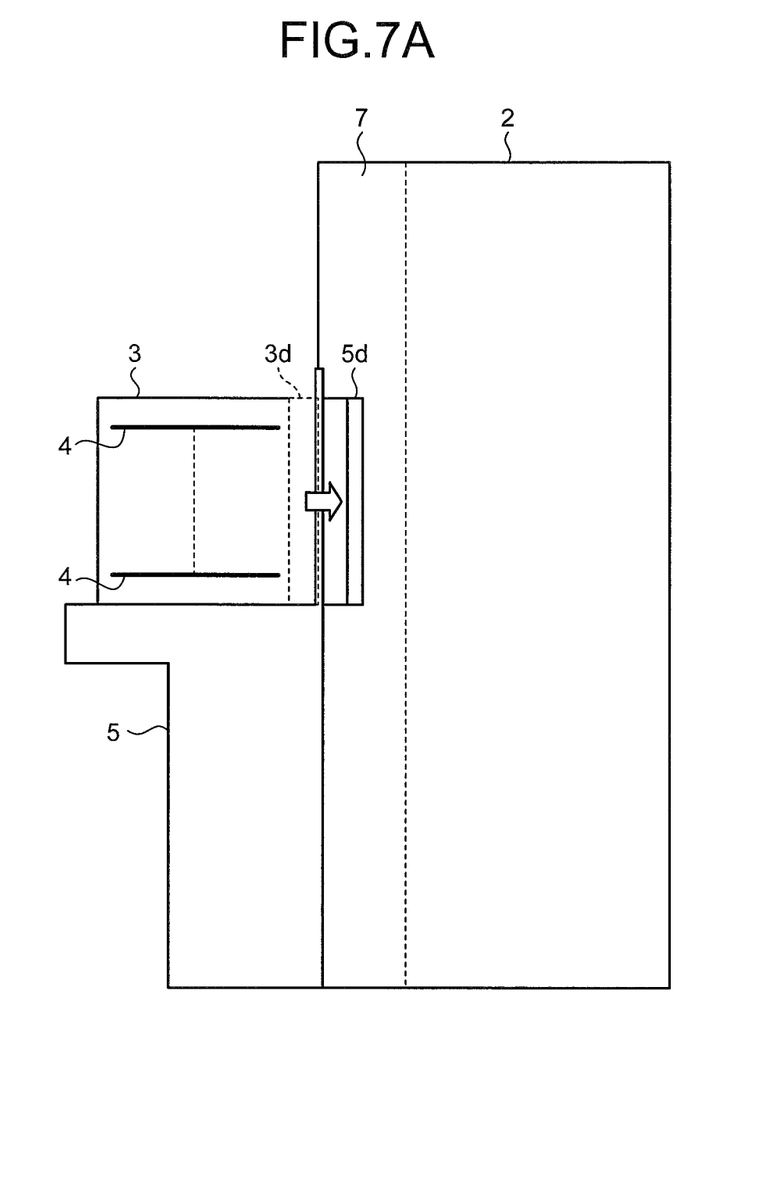
FIG. 7A is a first side view of the transfer room according to the present embodiment.
Figure 7B:
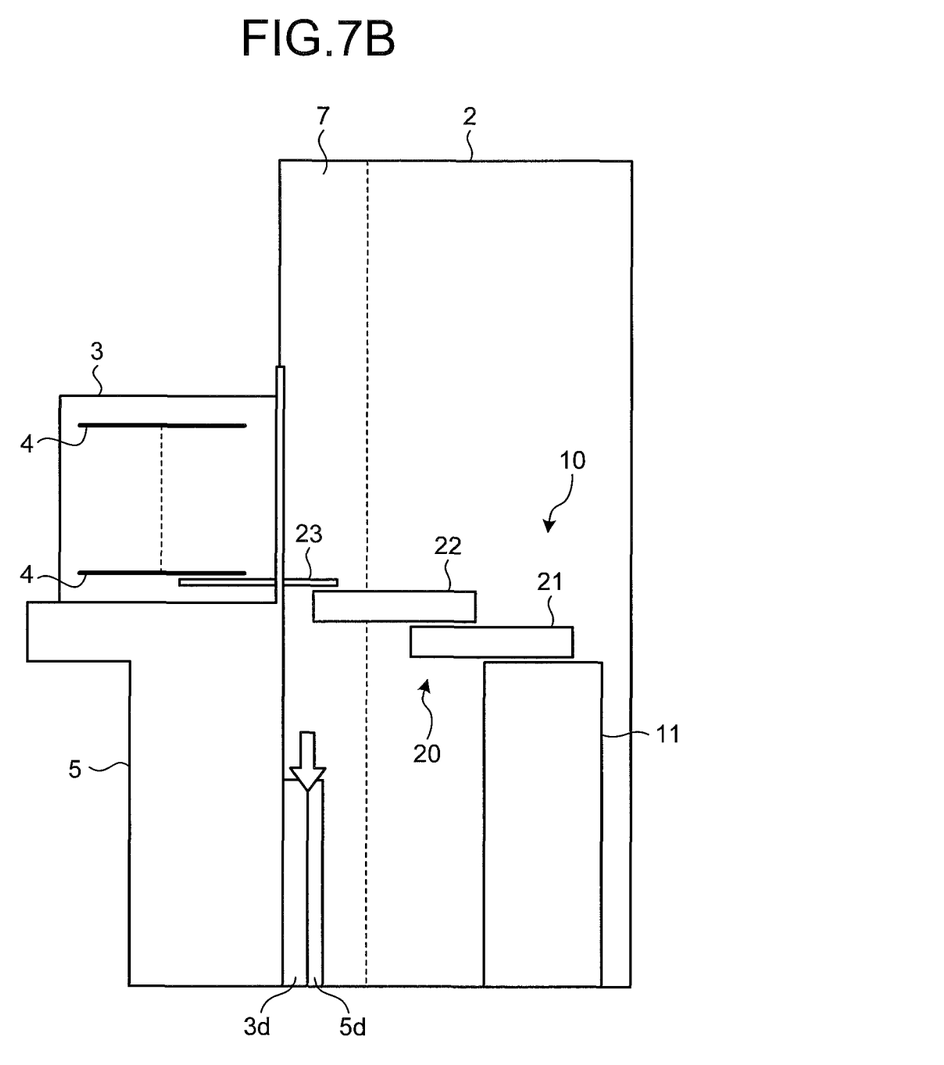
FIG. 7B is a second side view of the transfer room according to the present embodiment.

Next, the details of the attach/detach operation of the cover performed by the opening and closing device 5 will be described using FIGS. 7A and 7B. FIGS. 7A and 7B are side views of the transfer room 2 according to the present embodiment.

As illustrated in FIG. 7A, the opening and closing device 5 is installed at the opening formed on the side wall of the transfer room 2, and has a movable body 5d slidably moving up and down. The storage container 3 that stores the wafers 4 in multiple stages in the height direction is placed on the opening and closing device 5 so that a cover 3d provided on the storage container 3 faces the movable body 5d.

When opening the cover 3d of the storage container 3, the opening and closing device 5 moves the cover 3d toward the inside of the transfer room 2 (in the direction of the arrow in FIG. 7A) while keeping holding the cover 3d of the storage container 3 with the movable body 5d.

Then, as illustrated in FIG. 7B, the movable body 5d slides the cover 3d vertically downward (in the direction of the arrow in FIG. 7B) to open the cover 3d, and withdraws the cover 3d to a position where the cover 3d does not touch the transfer robot 10 carrying the wafer 4.

When closing the cover 3d of the storage container 3, the movable body 5d performs operations following the opposite procedure to the above-described procedure to close the cover 3d of the storage container 3. In this manner, the attach/detach operation of the cover 3d is performed in the exclusive area 7.

For this reason, in order to avoid a contact with the transfer robot 10, the transfer system 1 according to the present embodiment prohibits each of the opening and closing devices 5 from performing the attach/detach operation of the cover 3d when a part of the arm unit 20 is going to intrude into the exclusive area 7. In addition, when any one of the opening and closing devices 5 is about to execute or executing the attach/detach operation, the transfer system 1 according to the present embodiment limits the arm unit 20 so as not to intrude into the exclusive area 7 corresponding to the storage container 3 until the attach/detach operation of the cover 3d of the corresponding storage container 3 is terminated.

Figure 8:
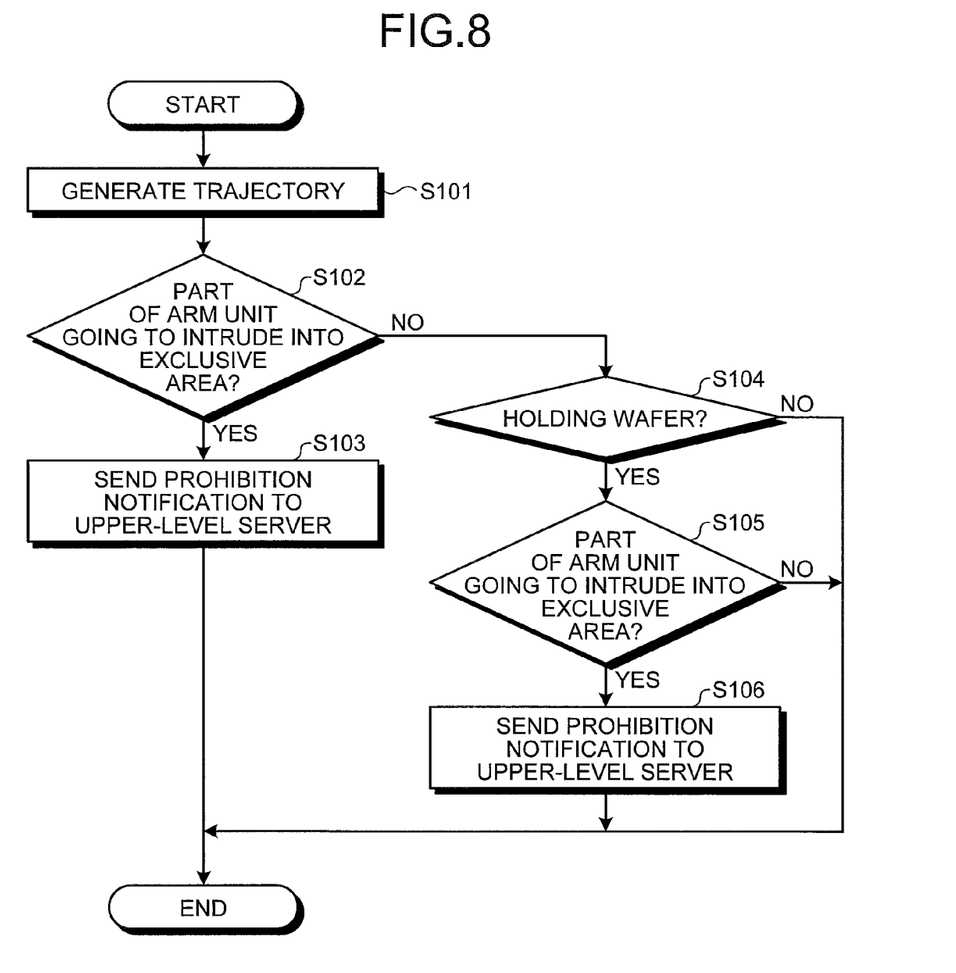
FIG. 8 is a flow chart illustrating a processing procedure of the intrusion determination processing.

Next, the details of the intrusion determination processing performed by the robot controller 30 will be described using FIG. 8. FIG. 8 is a flow chart illustrating a processing procedure of the intrusion determination processing. It should be noted that the robot controller 30 performs the intrusion determination processing illustrated in FIG. 8 in a repetitive manner at predetermined intervals of time.

As illustrated in FIG. 8, the trajectory generator 33a generates the trajectory of the hand 23 (Step S101), and sends the generated trajectory to the determination unit 33b. Then, based on the trajectory generated by the trajectory generator 33a and on the virtual figures, the determination unit 33b determines whether a part of the arm unit 20 is going to intrude into any part of the exclusive area 7 (Step S102).

If a part of the arm unit 20 is going to intrude into any part of the exclusive area 7 (Yes at Step S102), the output unit 33c sends a prohibition notification to prohibit the attach/detach operation of the cover 3d corresponding to the part of the exclusive area 7 to the upper-level server 40 (Step S103), and the series of processing is terminated.

In contrast, if determining that no part of the arm unit 20 will intrude into the exclusive area 7 (No at Step S102), the determination unit 33b determines whether the hand 23 is holding the wafer 4 (Step S104).

If the hand 23 is not holding the wafer 4 (No at Step S104), the robot controller 30 terminates the series of processing. If the hand 23 is holding the wafer 4 (Yes at Step S104), the determination unit 33b determines, based on the virtual figures with the wafer 4 taken into account, whether a part of the arm unit 20 is going to intrude into any part of the exclusive area 7 (Step S105).

If a part of the arm unit 20 is going to intrude into any part of the exclusive area 7 (Yes at Step S105), the output unit 33c sends the prohibition notification to prohibit the attach/detach operation of the cover 3d corresponding to the part of the exclusive area 7 to the upper-level server 40 (Step S106), and the series of processing is terminated.

If it is determined that no part of the arm unit 20 will intrude into the exclusive area 7 (No at Step S105), the robot controller 30 terminates the series of processing. Upon receiving the prohibition notification from the output unit 33c, the upper-level server 40 instructs the opening and closing device 5 not to execute the attach/detach operation of the cover 3d, although not illustrated.

Figure 9:
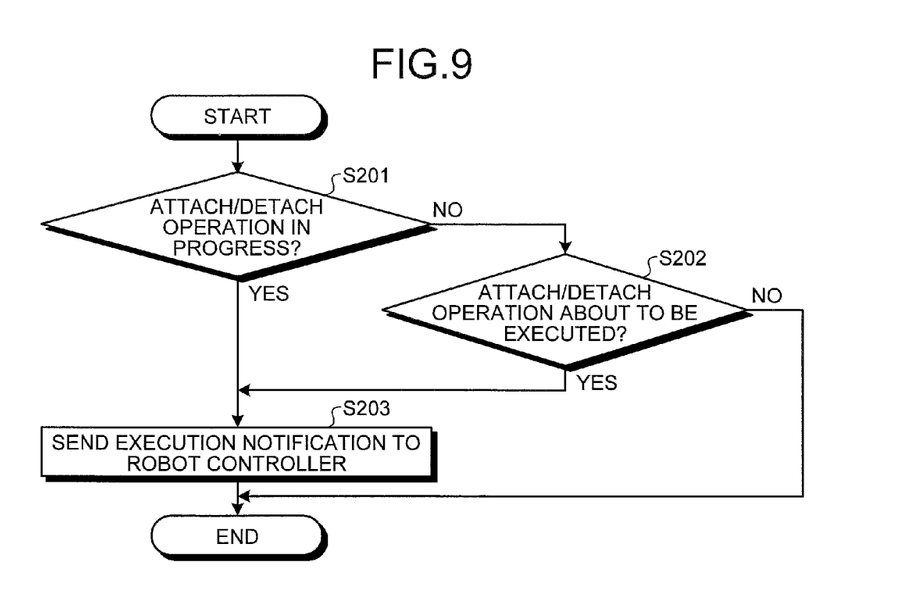
FIG. 9 is a flow chart illustrating a processing procedure of execution notification sending processing.

Next, details of the execution notification sending processing performed by the upper-level server 40 will be described using FIG. 9. FIG. 9 is a flow chart illustrating a processing procedure of the execution notification sending processing. The upper-level server 40 performs the execution notification sending processing illustrated in FIG. 9 in a repetitive manner at predetermined intervals of time.

As illustrated in FIG. 9, the upper-level server 40 determines whether any one of the opening and closing devices 5 installed side by side on the transfer room 2 is executing the attach/detach operation of the cover 3d (Step S201). If any one of the opening and closing devices 5 is executing the attach/detach operation (Yes at Step S201), the upper-level server 40 sends the execution notification of the attach/detach operation to the robot controller 30 (Step S203), and terminates the series of processing.

Note that the execution notification refers to a signal indicating that the opening and closing device 5 is about to execute or is executing the attach/detach operation of the cover 3d.

If none of the opening and closing devices 5 is executing the attach/detach operation (No at Step S201), the upper-level server 40 determines whether any one of the opening and closing devices 5 is about to execute the attach/detach operation (Step S202). If any one of the opening and closing devices 5 is about to execute the attach/detach operation (Yes at Step S202), the upper-level server 40 shifts the processing to Step 203 to send the execution notification of the attach/detach operation to the robot controller 30 (Step S203), and terminates the series of processing.

If none of the opening and closing devices 5 is about to execute the attach/detach operation (No at Step S202), the upper-level server 40 terminates the series of processing. Upon receiving the execution notification of the attach/detach operation from the upper-level server 40, the robot controller 30 limits the arm unit 20 so as not to intrude into the part of the exclusive area 7 corresponding to the opening and closing device 6 until the opening and closing device 5 terminates the attach/detach operation.

In the transfer system 1 according to the present embodiment, depending on whether the attach/detach operations are executed by all of the opening and closing devices 5, the arm unit 20 is placed in the predetermined standby attitude. However, the transfer system 1 may place the arm unit 20 in the predetermined standby attitude when any one of the opening and closing devices 5 executes the attach/detach operation.

For example, when the opening and closing device 5a is executing the attach/detach operation and the arm unit 20 moves to the opening and closing device 5a, the transfer system 1 may place the arm unit 20 in the standby attitude at a position near the opening and closing device 5a. With this configuration, the transfer robot 10 can quickly move the hand 23 to a desired position after the opening and closing device 5 terminates the attach/detach operation.

In the transfer system 1 according to the present embodiment, the transfer robot 10 is disposed so that the turning center of the arm unit 20 in the minimum turning area is positioned relatively close to the opposed wall surface opposed to the wall surface of the transfer room 2 on which the opening and closing devices 5 are mounted.

Figure 10:
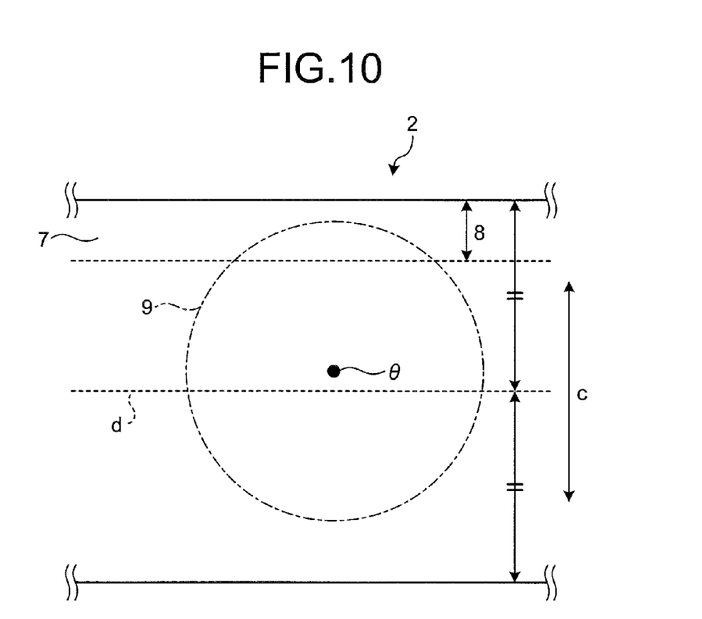
FIG. 10 is a top view of a transfer room according to a modification of the embodiment.

However, not limited to this disposition, for example, as illustrated in FIG. 10, the transfer robot 10 may be disposed so that the turning center θ of the circle 9 representing the minimum turning area of the arm unit 20 is positioned relatively close to the wall surface of the transfer room 2 on which the opening and closing devices 5 are mounted.

Specifically, the transfer robot 10 is disposed so that the turning center θ of the circle 9 representing the minimum turning area of the arm unit 20 is positioned between a bisector d of the side in the shorter direction c and the exclusive area 7. In this manner, the transfer robot 10 can be disposed so that the minimum turning area of the transfer robot 10 overlaps with the exclusive area 7, and thereby, the length in the shorter direction c of the transfer room 2 can be made small.

As described above, when a part of the arm provided in the transfer robot will intrude or has intruded into the exclusive area in the transfer room, the transfer system according to the present embodiment notifies the upper-level server to prohibit the attach/detach operations of the opening and closing device and the cover of the storage container. Upon receiving the notification to prohibit the attach/detach operation of the cover, the upper-level server instructs the opening and closing device not to execute the attach/detach operation.

If any one of the opening and closing devices is executing the attach/detach operation of the cover, the upper-level server notifies the robot controller that the attach/detach operation is in execution. Upon receiving the notification that the opening and closing device is executing the attach/detach operation of the cover, the robot controller instructs the transfer robot to take the standby attitude until the attach/detach operation of the cover is terminated.

In this manner, the transfer robot can be disposed so that the minimum turning area of the transfer robot overlaps with the exclusive area, and thereby, the length in the shorter direction of the transfer room can be made small. As a result, the transfer system according to the present embodiment can contribute to downsizing of the transfer room.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer system comprising:
   a transfer room that includes an exclusive area that includes a movable area of an opening and closing device opening and closing a storage container for thin plate-like workpieces, the opening and closing device being mounted on a wall surface;
   a robot that includes an arm unit that is equipped, at a terminal end thereof, with a robot band transferring the thin plate-like workpieces and operates in horizontal directions, the robot being installed in the transfer room so that a part of the arm unit passes through the exclusive area when the arm unit is folded so as to be in a shortest turning radius orientation;
   a trajectory generator that generates a trajectory of the robot hand;
   a determination unit that determines, based on the trajectory generated by the trajectory generator, whether a part of the arm unit intrudes into the exclusive area when the robot hand is not holding the thin plate-like workpieces, and that determines, based on the trajectory generated by the trajectory generator, whether an area obtained by adding an outer shape of the thin plate-like workpiece to the part of the arm unit intrudes into the exclusive area when the robot hand is holding the thin plate-like workpieces; and
   an output unit that outputs a predetermined signal when the determination unit determines that the part of the arm unit intrudes into the exclusive area and when the determination unit determines that the area obtained by adding the outer shape of the thin plate-like workpiece to the part of the arm unit intrudes into the exclusive area.

2. The transfer system according to claim 1, wherein the determination unit assumes virtual figures in predetermined positions of arms of the arm unit, and, depending on whether any of the virtual figures is included in the exclusive area, determines, if any of the virtual figures is included in the exclusive area, that a part of the arm unit is included in the exclusive area.

3. The transfer system according to claim 2, wherein the predetermined positions of the arms in which the virtual figures are assumed to be present are positions on axes of rotation of the arms and positions at centers between the axes of rotation of the arms.

4. The transfer system according to claim 3, wherein each of the virtual figures is a circle having a presettable diameter, and the presettable diameter is set so as to contain at least an outer shape of each of the arms.

5. The transfer system according to claim 2, wherein each of the virtual figures is a circle having a presettable diameter, and the presettable diameter is set so as to contain at least an outer shape of each of the arms.

6. The transfer system according to claim 1, wherein, if the determination unit determines that a part of the arm unit is included in the exclusive area, the output unit outputs a signal for prohibiting the opening and closing device from performing an attach/detach operation of as cover of the storage container in the exclusive area.

7. The transfer system according to claim 1, wherein
   the determination unit determines, at the latest before the arm unit executes a predetermined transfer command, whether the arm unit will intrude into the exclusive area if the predetermined transfer command is executed; and the output unit outputs, if the arm unit will intrude, a signal indicating that the arm unit will intrude or has intruded into the exclusive area, and thus restricts the operation of the opening and closing device in the exclusive area.

8. The transfer system according to claim 1, wherein the arm unit has arms and has a folded attitude in which straight lines each connecting axes of rotation of a base end and a leading end of each of the arms to each other overlap with each other, and in which a straight line connecting an axis of rotation of the robot hand to the placing center of the thin plate-like workpiece overlaps with the straight lines of the arms, and the robot has a standby attitude in which the folded attitude forms as certain degree of angle with an opposed wall surface opposed to the wall surface on which the opening and closing device is mounted so as not to interfere with either the opposed wall surface or the exclusive area.

9. The transfer system according to claim 8, further comprising:
   an acquisition unit that obtains an operating state of the opening and closing device; and
   an instruction unit that instructs, if the acquisition unit obtains the operating state indicating that the opening and closing device operates, the robot to take the standby attitude in which the arm unit is withdrawn from the exclusive area.

10. The transfer system according to claim 1, wherein the arm unit is installed so that the turning, center thereof in the minimum turning area is positioned relatively close to either the wall surface on which the opening and closing device is mounted or the opposed wall surface opposed to the wall surface.

11. The transfer system according to claim 10, wherein the turning center of the arm unit in the minimum turning area is positioned relatively close to the wall surface, and a part of the circular arc of the minimum turning area is included in the exclusive area.

12. The transfer system according to claim 1, wherein
   the opposed wall surface is placed in the minimum turning area of the arm unit; and
   the determination unit determines, at each predetermined time point, whether a part of the arm unit will hit the opposed wall surface opposed to the wall surface on which the opening and closing device is mounted.

13. The transfer system according to claim 12, wherein the predetermined time point comes immediately before an operation command to operate the robot hand is issued to the robot.

14. The transfer system according to claim 12, wherein the predetermined time point comes once every predetermined time period during the operation of the robot.

15. The transfer system according to claim 1, wherein the movable area is in an area in which a cover of the opening and closing device moves.

16. The transfer system according to claim 1, wherein
   the transfer unit includes:
      a first arm that is rotatably provided at a base end thereof;
      a second arm whose base end rotatably connects to an upper end of the first arm; and
      the robot hand rotatably connects to an upper end of the second arm, and
   the arm unit is folded so as to be in the shortest turning radius orientation when the second arm and the had are superimposed above the first arm.

17. The transfer system according to claim 1, wherein the robot includes a body upon which the arm unit is provided, and
the body is provided directly against a wall that is on a side of the transfer room that is opposite to the wall surface on which the opening and closing device is mounted.

18. A transfer system comprising:
   a transfer room that includes an exclusive area that includes a movable area of an opening and closing device opening and closing a storage container for thin plate-like workpieces, the opening and closing device being mounted on a wall surface;
   a robot that includes an aria unit that is equipped, at a terminal end thereof, with a robot hand transferring the thin plate-like workpieces and operates in horizontal directions, the robot being installed in the transfer room so that a part of the arm unit passes through the exclusive area when the arm unit is folded so as to be in a shortest turning radius orientation;
   trajectory generating means for generating as trajectory of the robot hand;
   determination means for determining, based on the trajectory generated by the trajectory generating means, whether a part of the arm unit intrudes into the exclusive area when the robot hand is not holding the thin plate-like workpieces, and that determines, based on the trajectory generated by the trajectory generating means, whether an area obtained by adding an outer shape of the thin plate-like workpiece to the part of the arm unit intrudes into the exclusive area when the robot hand is holding the thin plate-like workpieces; and
   output means for outputting a predetermined signal when the determination means determines that the part of the arm unit intrudes into the exclusive area and when the determination means determines that the area obtained by adding the outer shape of the thin plate-like workpiece to the part of the arm unit intrudes into the exclusive area.

19. The transfer system according to claim 18, wherein
the robot includes a body upon which the arm unit is provided, and
the body is provided directly against a wall that is on a side of the transfer room that is opposite to the wall surface on which the opening and closing device is mounted.

20. A transfer system comprising:
   a transfer room that includes an exclusive area defined by a predetermined distance inward from a wall surface on which an opening and closing device opening and closing a storage container for thin plate-like workpieces is mounted;
   a robot that includes an arm unit that is equipped, at a terminal end thereof, with a robot hand transferring the thin plate-like workpieces and operates in horizontal directions, the robot being installed in the transfer room so that a minimum tinning area of the arm unit overlaps with a part of the exclusive area;
   a trajectory generator that generates a trajectory of the robot hand;
   a determination unit that determines, based on the trajectory generated by the trajectory generator, whether a part of the arm unit is included in the exclusive area; and
   an output unit that outputs a predetermined signal based on a result of the determination by the determination unit, wherein
   the determination unit assumes virtual figures in predetermined positions of arms of the arm unit, and, depending on whether any of the virtual figures is included in the exclusive area, that the part of the arm unit is included in the exclusive area, and each of the virtual figures is a circle having a presettable diameter, and the presettable diameter is set so as to contain at least an outer shape of each of the arms.

* * * * *